United States Patent
Liu

(10) Patent No.: US 9,188,961 B1
(45) Date of Patent: Nov. 17, 2015

(54) TIME-TO-DIGITAL CONVERTER

(71) Applicant: Micrel, Inc., San Jose, CA (US)

(72) Inventor: Bin Liu, Fremont, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 14/625,577

(22) Filed: Feb. 18, 2015

(51) Int. Cl.
*H03M 1/50* (2006.01)
*G04F 10/00* (2006.01)

(52) U.S. Cl.
CPC .............. *G04F 10/005* (2013.01); *H03M 1/50* (2013.01)

(58) Field of Classification Search
CPC .......... H03M 1/50; H03M 1/60; G04F 10/005
USPC ................................ 341/157, 166
See application file for complete search history.

(56) References Cited

U.S. PATENT DOCUMENTS

| | | | |
|---|---|---|---|
| 7,501,973 B2 * | 3/2009 | Choi et al. ............ | G04F 10/005 327/269 |
| 7,667,633 B2 * | 2/2010 | Choi et al. ............ | G04F 10/005 327/156 |
| 7,884,751 B2 * | 2/2011 | Shimizu et al. ......... | G04F 10/06 327/269 |
| 8,138,843 B2 * | 3/2012 | Straayer et al. ....... | G04F 10/005 324/76.54 |
| 8,330,637 B2 * | 12/2012 | Lee et al. .............. | G04F 10/005 327/149 |
| 2008/0069292 A1 | 3/2008 | Straayer et al. | |
| 2014/0201254 A1 | 7/2014 | Julian Jenkins | |

OTHER PUBLICATIONS

Babu et al. "All Digital Phase Locked Loop Design and Implementation." Project report, University of Florida, Gainesville, FL 32608 (2009).
Henzler et al. "90nm 4.7 ps-resolution 0.7-Isb single-shot precision and 19pj-per-shot local passive interpolation time-to-digital converter with on-chip characterization." Solid-State Circuits Conference, 2008. ISSCC 2008. Digest of Technical Papers. IEEE International. IEEE, 2008.
Lee et al. "A low-noise wideband digital phase-locked loop based on a coarse—fine time-to-digital converter with subpicosecond resolution." Solid-State Circuits, IEEE Journal of 44.10 (2009): 2808-2816.
Michael H. Perrott. "Tutorial on Digital Phase-Locked Loops." PowerPoint presentation. CICC 2009. Sep. 2009.
P.E. Allen. "All Digital Phase Lock Loops (ADPLL)." Lecture. ECE 6440—Frequency Synthesizers. May 15, 2003.
Stephan Henzler. "Time-to-Digital Converter Basics." Time-to-digital converters chapter 2. Springer Science & Business Media, 2010.
Yu et al. "A 12-bit vernier ring time-to-digital converter in 0.13 CMOS technology." Solid-State Circuits, IEEE Journal of 45.4 (2010): 830-842.

* cited by examiner

*Primary Examiner* — Khai M Nguyen
(74) *Attorney, Agent, or Firm* — Van Pelt, Yi & James LLP

(57) ABSTRACT

A time-to-digital converter (TDC) incorporates a resistor-stabilized delay line, a sampling circuit and a processing circuit. The resistor-stabilized delay line operates to limit the variation in delay values for the delay elements in the delay line due to fabrication process variations. In some embodiments, the resistor-stabilized delay line limits the delay variation of each delay element to a fraction of the delay.

10 Claims, 6 Drawing Sheets

TIME-TO-DIGITAL CONVERTER

BACKGROUND OF THE INVENTION

As CMOS process technology pushes towards smaller and smaller geometry and faster transistors with greater circuit density become available, the time-domain resolution of a digital signal edge transition becomes superior to the voltage resolution of an analog signal. As a result, digital phase locked loops can achieve same or better performance over analog phase locked loops while bringing benefits of digital approach such as easy programmability, significantly smaller area for loop filter, easy portability between different processes, and scalability with CMOS advanced technology node development.

A digital phase locked loop, sometimes referred to as an all digital phase locked loop (ADPLL), refers to a phase locked loop (PLL) circuit implemented with only digital circuit blocks. In particular, a digital phase locked loop uses a time-to-digital converter (TDC) to replace the phase detector and the charge pump of the conventional analog PLL circuit. A digital phase locked loop is formed by the TDC as a digital phase detector, a digital loop filter, a digitally controlled oscillator (DCO), and appropriate feedback circuit. The time-to-digital converter (TDC) is used to quantize time information of a signal event relative to a reference event. The DCO performs frequency generation in response to the time delay measured by the TDC.

FIG. 1 duplicates FIG. 2 of U.S. Patent Publication 2008/0069292 and illustrates a conventional time-to-digital converter (TDC). FIG. 2 duplicates FIG. 1 of U.S. Patent Publication 2008/0069292 and illustrates the operation of the conventional time-to-digital converter (TDC) of FIG. 1. The conventional TDC is implemented using digital circuit elements including a serial configuration of delay stages and D flip-flops. The event signal is propagated through the serial configuration of delay stages. In time, the event signal edge moves from left to right of the delay chain, from the first stage to the last stage. At the arrival of the reference signal edge, the delayed versions of the event signal edge at all the delay stages are sampled in parallel. For example, D flip flops are used as the sampling element. The sampling of the delayed versions of the event signal edge by the reference signal edge results in a thermometer code at the outputs of the sampling elements. For instance, all delay stages which have been already passed by the event signal edge give a logical High value at the outputs of the sampling elements and all delay stages which have not been passed by the event signal edge yet give a logical Low value, resulting in a thermometer code. The position of the High-Low transition in the thermometer code indicates how far the event signal could propagate during the time interval spanned by the event signal and the reference signal.

In a TDC, the High-Low transition of the thermometer code output is a measure for the time interval ($t_{in}$) between event signal edge ($t_{event}$) and the reference signal edge ($t_{ref}$), with some quantization error. More specifically, the time interval $t_{in}$ to be measured is approximated by the TDC as an output time ($t_{out}$) with quantization error $t_q$. The thermometer code output of the TDC can be converted to an output time value by computing the product of the number of high transitions and the delay time of a single delay stage.

The minimum resolution of the conventional TDC is limited by the fabrication process technology which determines the time delay for the delay stages. The delay stages of the TDC are typically implemented using buffers or inverters. Thus, the time delay of the buffers or inverters sets the resolution of the TDC. Although the time delay of the buffers is improving steadily with advanced process technology, the resolution that can be provided by these delay elements is still not adequate for low phase noise or low phase jitter ADPLL.

Various techniques have been developed to achieve time resolution smaller than the intrinsic delay of buffers or inverters. U.S. Patent Publication 2014/0201254 proposes using a delay element fabric and a phase generator to construct the delay line in which the phase generator splits the digital input signal in multiple incrementally delayed versions for the fabric inputs and the delay element fabric generates sub inverter delay after phase mixing of incrementally delayed signals. Other techniques have also been proposed.

While the delay line constructed using these techniques can achieve sub inverter delays, the TDCs employing these techniques suffer the "missing code" or "bubbles" problems at the thermometer code output of the TDC. The missing code or bubbles problems are caused by variations in the delay of the delay elements where the delay variations are caused by fabrication process variations. The large delay variations among delay elements represent a major road block to achieve high resolution in time-to-digital conversion.

More specifically, FIGS. 3(a) and 3(b) illustrate the missing code error in a TDC which can result when the delay variations become too large relative to the delay of each delay element in the TDC. FIG. 3(a) illustrates the ideal operation of a TDC. In response to an event signal edge (1), a series of delayed event signals (2-5) are generated by the delay line, each delayed even signal having a signal edge delayed from the previous signal by the delay amount δ. At the arrival of the reference signal edge (8), the delayed event signals are sampled in parallel. In the example shown in FIG. 3(a), an output code of "11000" is generated.

FIG. 3(b) illustrates the operation of a TDC in the presence of large delay variations of the delay elements. For example, due to process variations, the first delay element may have a delay larger than δ while the third delay element may have a delay smaller than δ. At the arrival of the reference signal edge (8) when the delayed event signals are sampled in parallel, the wrong output code "10100" is obtained. The TDC is therefore not able to determine the correct time interval to be measured.

In particular, in older process technologies, the delay element may provide a larger delay of 50 ps. If the delay variation is 10 ps, then the delay variation is not that critical as it is only a percentage of the delay element resolution. However, as process technology improves over the years, delay elements may be made with smaller and smaller delays, such as 1 ps. In that case, the variation of the delay due to process variation becomes a problem as the delay variation becomes larger than the delay itself. For example, a delay element may have a 1 ps delay but a delay variation of 3 ps. Thus, even though the reducing delay of the delay elements improves the TDC resolution by improving the phase noise, the large delay variations in the delay elements limit the practical use of TDC and the practical realization of digital phase locked loops.

BRIEF DESCRIPTION OF THE DRAWINGS

Various embodiments of the invention are disclosed in the following detailed description and the accompanying drawings.

DETAILED DESCRIPTION

Figure 1:
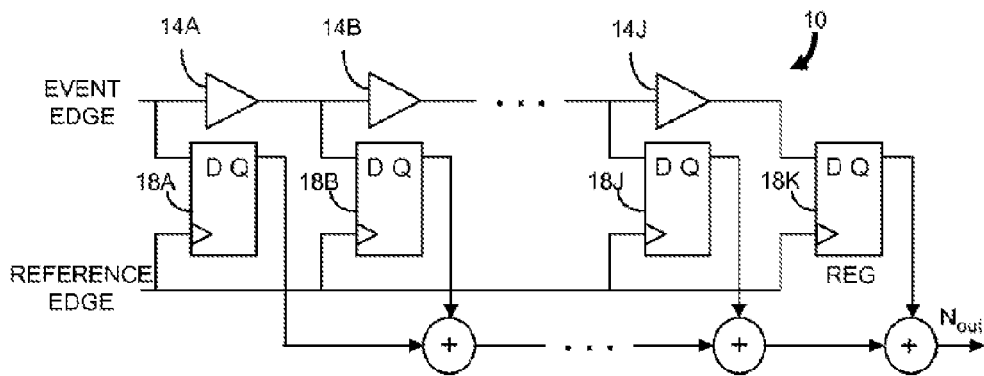
FIG. 1 duplicates FIG. 2 of U.S. Patent Publication 2008/0069292 and illustrates a conventional time-to-digital converter (TDC).
Figure 2:
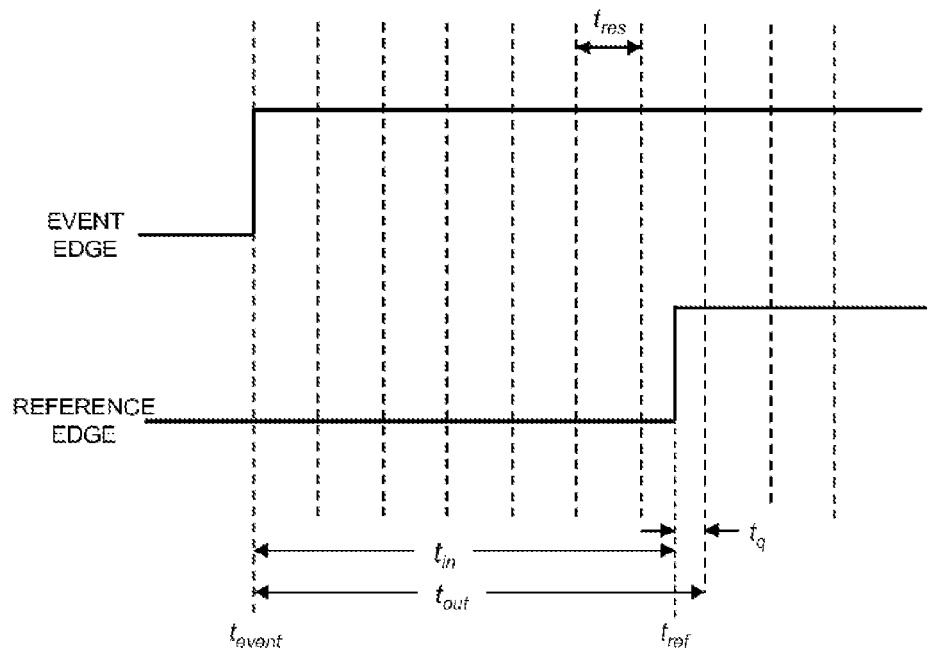
FIG. 2 duplicates FIG. 1 of U.S. Patent Publication 2008/0069292 and illustrates the operation of the conventional time-to-digital converter (TDC) of FIG. 1.
Figure 3A:
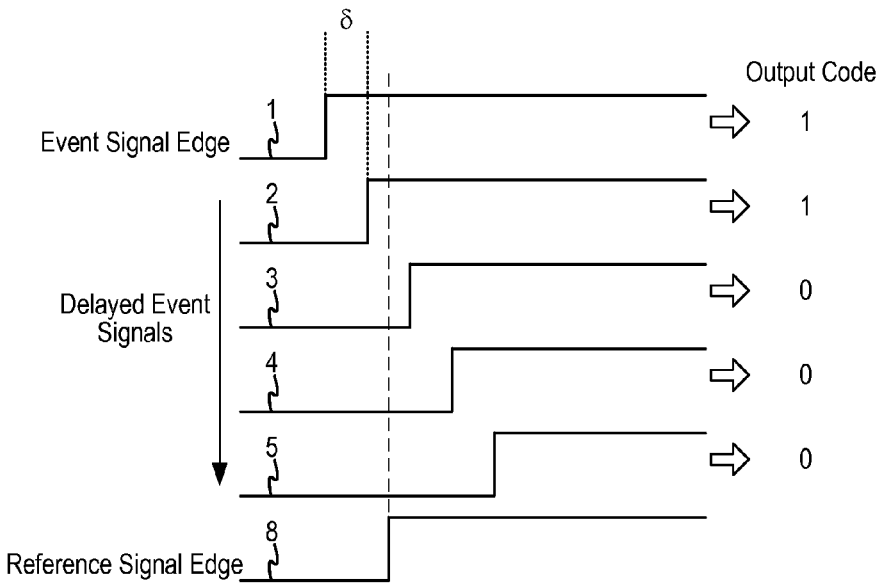
FIG. 3(a) illustrates the signal waveforms of an ideal operation of a TDC.
Figure 3B:
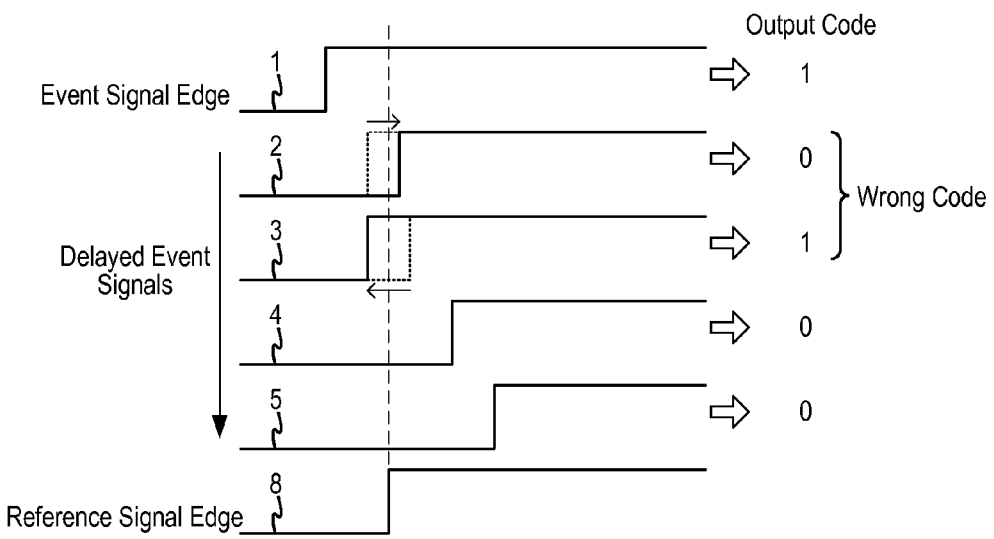
FIG. 3(b) illustrates the signal waveforms of the operation of a TDC in the presence of large delay variations of the delay elements.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a time-to-digital converter (TDC) incorporates a resistor-stabilized delay line to limit the variation in delay values for the delay elements in the delay line due to fabrication process variations. In some embodiments, the resistor-stabilized delay line limits the delay variation of each delay element to a fraction of the delay. In this manner, the performance of the time-to-digital converter is significantly improved as the missing code problem is obviated. Accordingly, a time-to-digital converter can be constructed using sub-micron fabrication technologies to reduce the phase noise while any delay variation of the delay line due to fabrication process variations is stabilized by the resistor chain.

With the delay variations of the delay elements stabilized, practical applications of the TDC of the present invention can be realized. In some embodiments, the TDC of the present invention with the resistor-stabilized delay line can be advantageously applied to construct an all digital phase locked loop. In particular, an all digital phase locked loop can be constructed using deep sub-micron process technologies to realize lower phase noise while the resistor-stabilized delay line ensures high performance level.

In embodiments of the present invention, the time-to-digital converter incorporating a resistor-stabilized delay line may be constructed using non-inverting buffers in the delay line or using inverters in the delay line. Furthermore, in embodiments of the present invention, the time-to-digital converter incorporating a resistor-stabilized delay line may be constructed using a single-ended delay line or using a differential delay line.

More specifically, in a conventional delay line constructed of either buffers or inverters as the delay elements, the delay of the delay elements vary around a mean delay value due to fabrication process variations. The delay variation of the delay elements becomes increasingly pronounced as the process technology scales down to smaller geometry, especially in the sub-micron regime. So while the resolution of the delay element can be improved, the delay variations of the delay element become larger.

However, as a nature of the integrated circuit fabrication processes, active devices, such as CMOS transistor devices, may suffer from large variations due to process variations while passive devices in the same fabrication process may be more immune to process variations. Thus, while delay elements constructed using active devices suffer from large delay variations, passive elements constructed in the same fabrication process usually have small variations in element values. For example, a resistor in a fabrication process may have only a 1% variation in resistance values over fabrication process variations. In embodiments of the present invention, a resistor chain is applied to a delay line to stabilize or limit the delay variations of the delay elements in the delay line.

Figure 4:
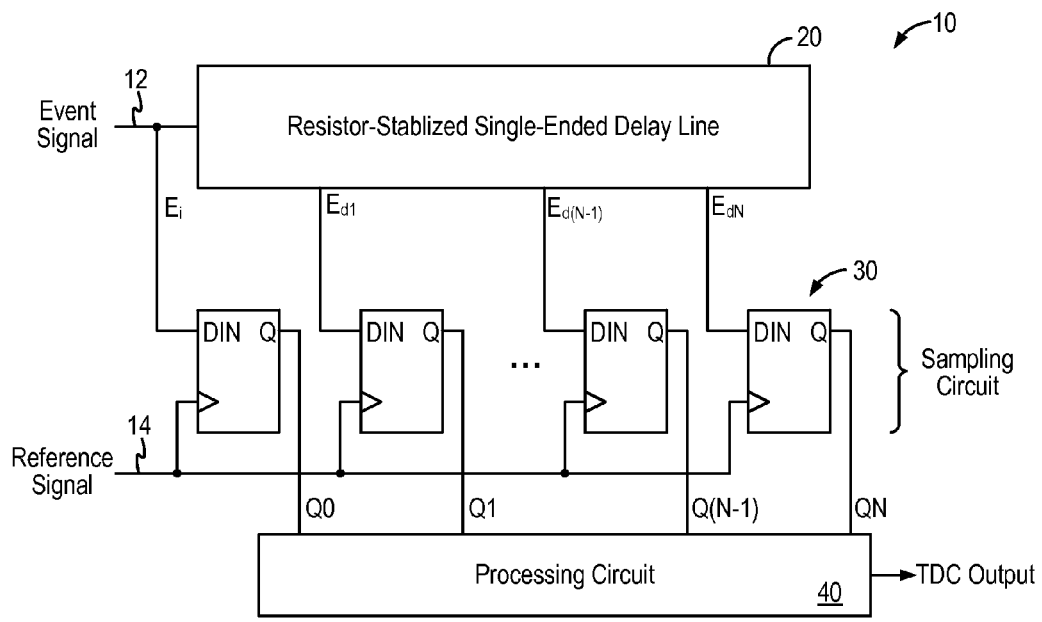
FIG. 4 is a schematic diagram illustrating a time-to-digital converter incorporating a resistor-stabilized delay line in embodiments of the present invention.

FIG. 4 is a schematic diagram illustrating a time-to-digital converter incorporating a resistor-stabilized delay line in embodiments of the present invention. Referring to FIG. 4, a TDC 10 includes a resistor-stabilized delay line 20, a sampling circuit 30 and a processing circuit 40. In the present embodiment, the resistor-stabilized delay line 20 is a single-ended delay line including a serial configuration of delay elements. The delay elements can be implemented as non-inverting buffers or inverters. In the present embodiment, the sampling circuit 30 is implemented using a serial chain of D flip-flops as the sampling elements. The event signal (node 12) is coupled to the delay line 20 and is propagated through the serial configuration of delay elements. In time, the event signal edge moves from the first delay element to the last delay element of the delay line 20. The delayed version ($E_{d1}$ to $E_{dN}$) of the event signal edge generated by each delay element is coupled to a respective D flip-flop as the data input.

A reference signal (node 14) is coupled to the chain of D flip-flops as the clock input to each D flip-flops. Accordingly, at the arrival of the reference signal edge, the delayed versions of the event signal edge at all the delay elements are sampled in parallel. The sampling of the delayed versions of the event signal edge by the reference signal edge results in a thermometer code (Q0 to QN) at the output of the sampling circuit 30. For instance, all delay elements which have been already passed by the event signal edge may give a logical High value at the outputs of the sampling elements and all delay elements which have not been passed by the event signal edge yet may give a logical Low value at the outputs of the sampling elements, resulting in a thermometer code. The position of the High-Low transition in the thermometer code indicates how far the event signal has propagated during the time interval spanned by the event signal and the reference signal.

More specifically, the transition of the thermometer code output indicating the measured time interval can be a high-to-low transition or other transition pattern depending on the construction of the delay line and the logical level of the event signal. The specific logical level or transition pattern of the thermometer code is not critical to the practice of the present invention. In the present embodiment, the event signal edge is assumed to be a low-to-high transition and the sampling circuit is assumed to provide non-inverting outputs. When the delay line is implemented using non-inverting buffers as the delay elements, the thermometer code output will have a High-to-Low transition to indicate the time interval to be measured. When the delay line is implemented using inverting buffers or inverters as the delay elements, the thermometer code output will have an alternating High-Low sequence as output with the phase change in the alternating High-Low sequence indicating the measured time interval.

In the present example, the High-Low transition of the thermometer code output is a measure for the time interval ($t_{in}$) between event signal edge ($t_{event}$) and the reference signal edge ($t_{ref}$), with some quantization error. More specifically, the time interval $t_{in}$ to be measured is approximated by the TDC as an output time ($t_{out}$) with quantization error $t_q$. The thermometer code output can be converted to an output time value by computing the product of the number of high transitions and the delay time of a single delay stage, for example. In the present embodiment, the thermometer code output (Q0 to QN) of the sampling circuit 30 is provided to the processing circuit 40 to generate a TDC output signal indicative of the measured time interval indicated by the transition in the thermometer code output. For example, the processing circuit 40 can be configured to compute the product of the number of high transitions in the thermometer code output and the delay time of a single delay element.

The resolution of the TDC 10 is determined by the delay (or delay time) of the delay elements in the delay line 20. Meanwhile, the delay time values of the delay elements in the delay line 20, buffers or inverters, have variations due to fabrication process variations. In embodiments of the present invention, a resistor chain is coupled to the delay line 20 to stabilize the delay variation. The resistor stabilized delay line 20 is able to realize delay variation much smaller than the delay value itself. The construction of the resistor-stabilized delay line will be explained in more detail below.

Figure 5:
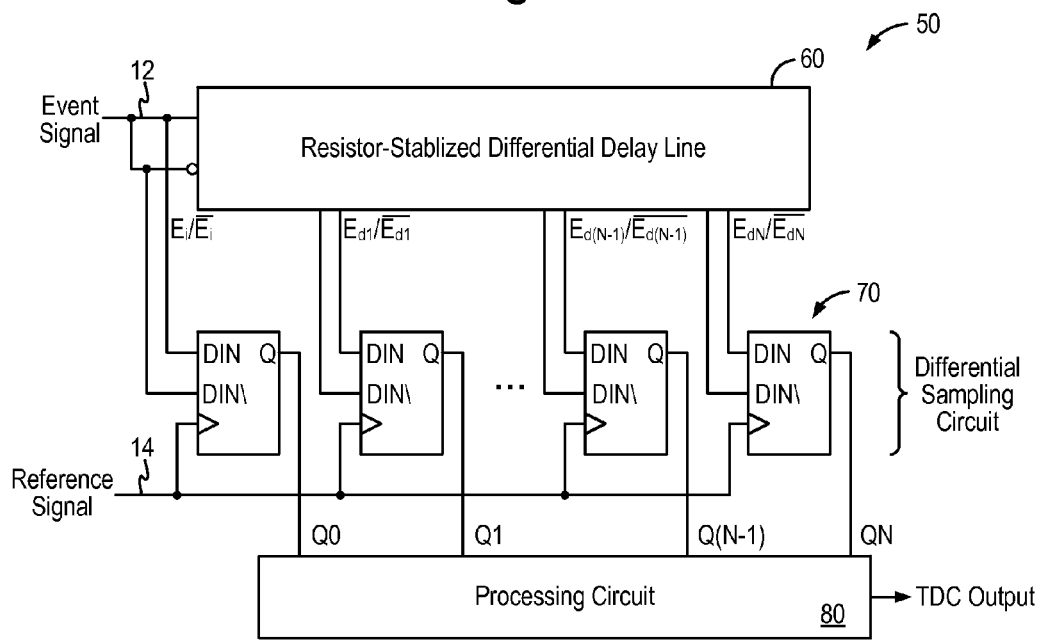
FIG. 5 is a schematic diagram illustrating a time-to-digital converter incorporating a resistor-stabilized delay line in an alternate embodiment of the present invention.

FIG. 5 is a schematic diagram illustrating a time-to-digital converter incorporating a resistor-stabilized delay line in an alternate embodiment of the present invention. Referring to FIG. 5, a TDC 50 includes a resistor-stabilized delay line 60, a sampling circuit 70 and a processing circuit 80. In the present embodiment, the resistor-stabilized delay line 60 is a differential delay line including a pair of serial strings of delay elements, a first serial string of delay elements receiving the event signal and a second serial string of delay elements receiving the inverse of the event signal. The delay elements can be implemented as non-inverting buffers or inverters. The sampling circuit 70 is implemented as a differential sampling circuit and in the present embodiment, a serial chain of differential registers is used as the sampling elements. The event signal (node 12) is coupled to the differential delay line 60 and is propagated through the pair of serial configuration of delay elements. The operation of the TDC 50 is the same as TDC 10 of FIG. 4 except for the use of differential signaling in the delay line and the inputs to the sampling circuit and will not be further described.

The resolution of the TDC 50 is determined by the delay of the delay elements in the delay line 60. Meanwhile, the delay values of the delay elements in the delay line 60, buffers or inverters, have variations due to fabrication process variations. In embodiments of the present invention, a resistor chain is coupled to the delay line 60 to stabilize the delay variation. The resistor stabilized delay line 60 is able to realize delay variation much smaller than the delay value itself. The construction of the resistor-stabilized delay line will be explained in more detail below.

In embodiments of the present invention, the resistor-stabilized delay line includes a resistor chain connected to the delay elements. More specifically, each resistor in the resistor chain is connected across one or two delay elements and is connected across two common mode nodes of adjacent delay elements in the delay line. In the present description, common mode nodes refer to nodes where the signals swings together or the signal voltages have the same polarity. Accordingly, when the delay elements in the resistor-stabilized delay line are inverting delay elements, such as inverters, each resistor in the resistor chain will be connected across two delay elements. On the other hand, when the delay elements in the resistor-stabilized delay line are non-inverting delay elements, such as non-inverting buffers, each resistor in the resistor chain will be connected across a single delay element.

Figure 6:
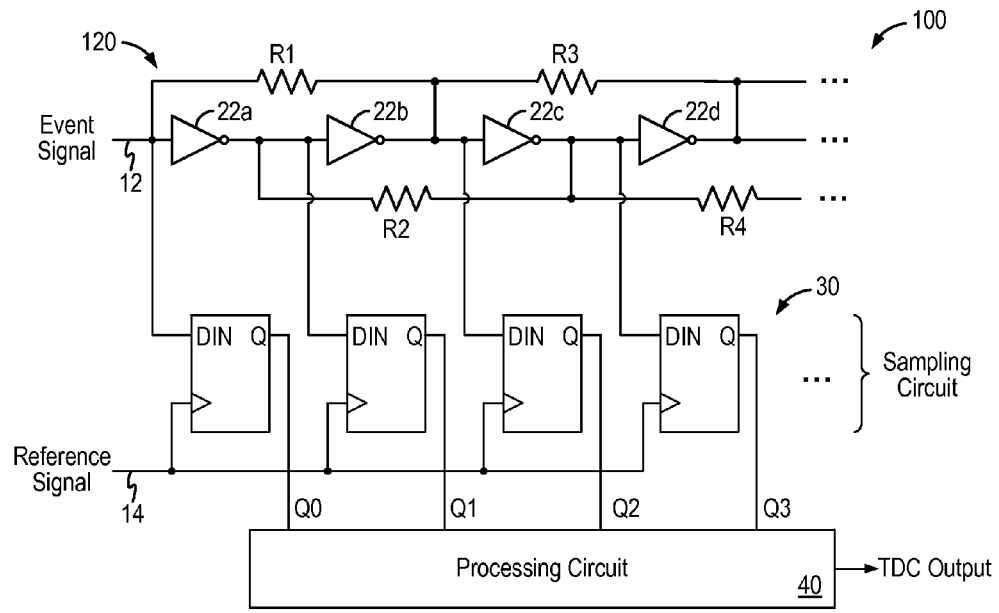
FIG. 6 is a schematic diagram illustrating a time-to-digital converter incorporating a resistor-stabilized inverter delay line with single-ended signaling in embodiments of the present invention.

FIG. 6 is a schematic diagram illustrating a time-to-digital converter incorporating a resistor-stabilized inverter delay line with single-ended signaling in embodiments of the present invention. In particular, FIG. 6 illustrates a TDC 100 constructed in a similar manner as TDC 10 of FIG. 4 and further illustrates the detail construction of a resistor-stabilized delay line 120 in the form of an inverter delay line with single-ended signaling. Like elements in FIGS. 4 and 6 are given like reference numerals and will not be further described.

Referring to FIG. 6, the resistor-stabilized delay line 120 includes a serial chain of inverters 22 as the delay elements. The event signal (node 12) is provided to the first inverter 22a and the event signal is propagated down the inverter chain (inverters 22b, 22c, . . . ) to generate delayed versions of the event signal edge at the output of each inverter. The delay versions of the event signal edge are inverted at alternate inverters 22. A resistor chain is connected to the delay elements to stabilize the delay variations of the inverters. The resistors of the resistor chain are connected to the delay elements by connecting across pairs of common mode nodes of adjacent delay elements in the delay line. Accordingly, each resistor is connected across two inverters of the delay line and each node in the delay line is connected to a resistor.

For example, a resistor R1 is connected across inverter 22a and inverter 22b. That is, resistor R1 is connected between the input to inverter 22a and the output of inverter 22b. Meanwhile, a resistor R2 is connected across inverter 22b and inverter 22c. The resistor chain connection continues with a resistor R3 connected across inverter 22c and 22d, and so on. In this manner, each resistor is connected across two inverting delay elements and each node in the delay line is connected to a resistor of the resistor chain.

Figure 7:
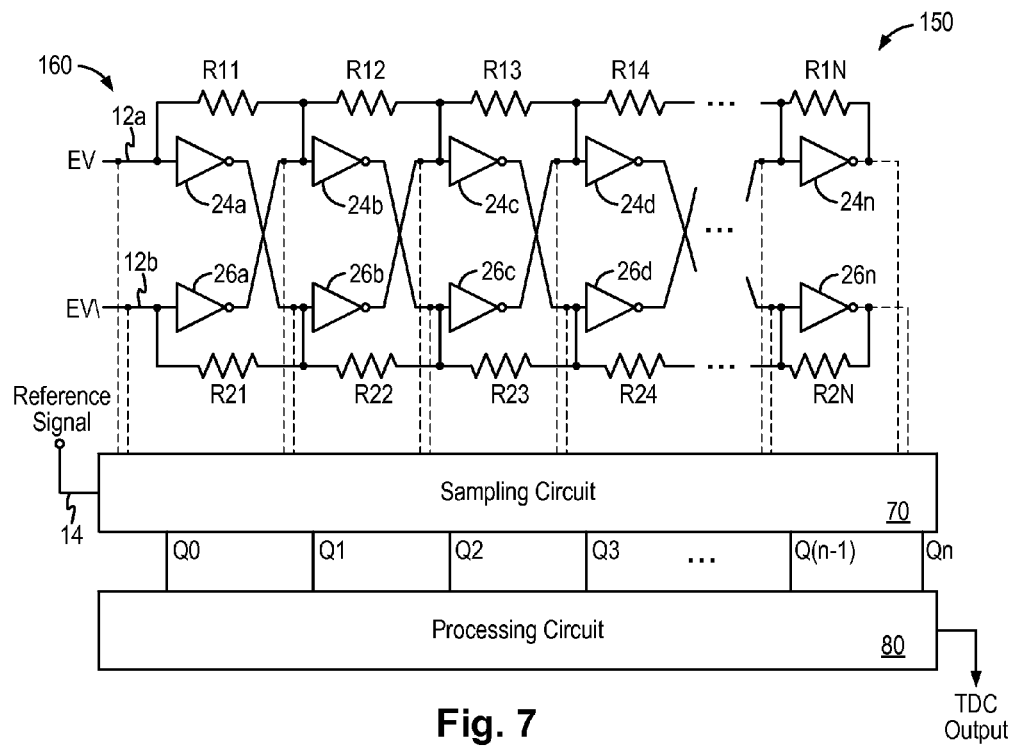
FIG. 7 is a schematic diagram illustrating a time-to-digital converter incorporating a resistor-stabilized inverter delay line with differential signaling in embodiments of the present invention.

FIG. 7 is a schematic diagram illustrating a time-to-digital converter incorporating a resistor-stabilized inverter delay line with differential signaling in embodiments of the present invention. In particular, FIG. 7 illustrates a TDC 150 constructed in a similar manner as TDC 50 of FIG. 5 and further illustrates the detail construction of a resistor-stabilized delay line 160 in the form of an inverter delay line with differential signaling. Like elements in FIGS. 5 and 7 are given like reference numerals and will not be further described.

Referring to FIG. 7, the resistor-stabilized delay line 160 includes a first serial chain of inverters 24 and a second serial chain of inverters 26 as the delay elements. The event signal (node 12a) is provided to the inverter 24a and the inverse of the event signal (node 12b) is provided to the inverter 26a. The event signal is propagated down the pair of inverter chains to generate delayed versions of the event signal edge, in differential format, at the output of each delay stage. More specifically, the two chains of inverters 24 and 26 are cross-connected. That is, the output of an inverter 24 of the first serial chain is connected to the input of an inverter 26 of the second serial chain in the following delay stage. Meanwhile, the output of an inverter 26 of the second serial chain is connected to the input of an inverter 24 from the first serial chain in the following delay stage, and so on. For example, the output of an inverter 24a from the first serial chain is connected to the input of an inverter 26b from the second serial chain. The output of an inverter 26a from the second serial chain is connected to the input of an inverter 24b from the first serial chain. In the next delay stage, the output of an inverter 24b from the first serial chain is connected to the input of an inverter 26c from the second serial chain. The output of an inverter 26b from the second serial chain is connected to the input of an inverter 24c from the first serial chain. The cross-connection of the first and second serial chain of inverters 24, 26 continues in this manner to the last inverter elements 24n and 26n.

A resistor chain is connected to the delay elements in the differential delay line to stabilize the delay variations of the inverters. For the differential delay line, the resistor chain includes a first serial chain of resistors R11 to R1N and a second serial chain of resistors R21 to R2N. The resistors of the resistor chain are connected to the delay elements by connecting across pairs of common mode nodes of adjacent delay elements in the delay line. In the case that the inverters 24 and 26 are cross-connected, each resistor is connected across the input node of one inverter and the input node of the following inverter in the same serial chain of inverters to realize the common mode connection.

For example, a resistor R11 is connected across the input node to inverter 24a and the input node to inverter 24b, where the two input nodes are common mode nodes. A resistor R12 is connected across the input node to inverter 24b and the input node to inverter 24c, where the two input nodes are common mode nodes. Meanwhile, a resistor R21 is connected across the input node to inverter 26a and the input node to inverter 26b, where the two input nodes are common mode nodes. A resistor R22 is connected across the input node to inverter 26b and the input node to inverter 26c, where the two input nodes are common mode nodes. In this manner, each resistor is connected to two common nodes in each serial chain of inverters.

Figure 8:
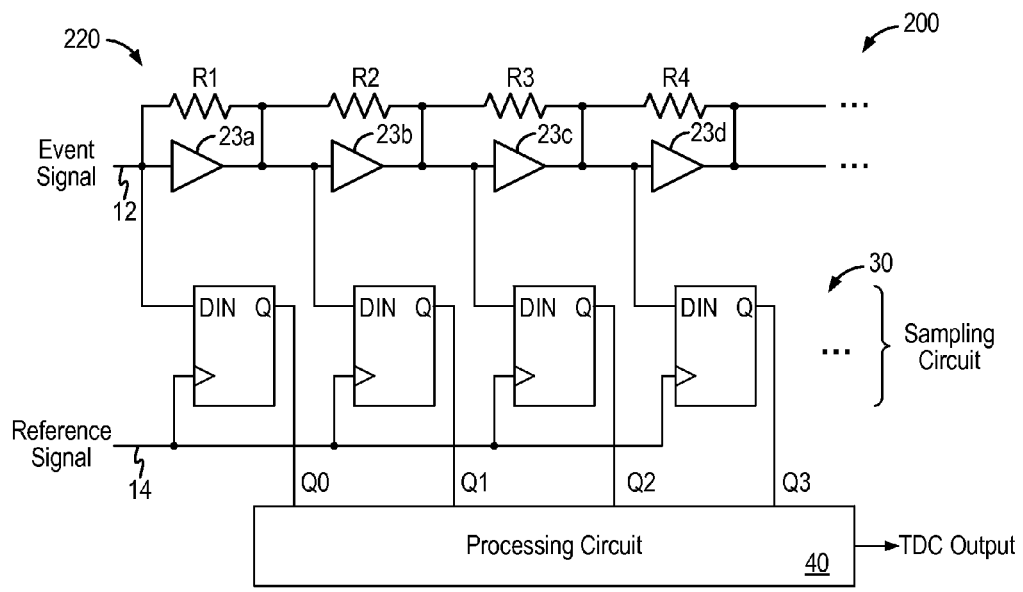
FIG. 8 is a schematic diagram illustrating a time-to-digital converter incorporating a resistor-stabilized buffer delay line with single-ended signaling in embodiments of the present invention.

FIG. 8 is a schematic diagram illustrating a time-to-digital converter incorporating a resistor-stabilized buffer delay line with single-ended signaling in embodiments of the present invention. In particular, FIG. 8 illustrates a TDC 200 constructed in a similar manner as TDC 10 of FIG. 4 and further illustrates the detail construction of a resistor-stabilized delay line 120 in the form of a buffer delay line with single-ended signaling. Like elements in FIGS. 4 and 8 are given like reference numerals and will not be further described.

Referring to FIG. 8, the resistor-stabilized delay line 220 includes a serial chain of non-inverting buffers 23 as the delay elements. The event signal (node 12) is provided to the first buffer 23a and the event signal is propagated down the buffer chain (buffers 23b, 23c, . . . ) to generate delayed versions of the event signal edge at the output of each buffer. The delayed versions of the event signal edge have the same signal polarity at each buffer. A resistor chain is connected to the delay elements to stabilize the delay variations of the buffers. The resistors of the resistor chain are connected to the delay elements by connecting across pairs of common mode nodes of adjacent delay elements in the delay line. In the present embodiment, each resistor is connected across a single buffer of the delay line and each node in the delay line is connected to a resistor.

For example, a resistor R1 is connected across buffer 23a. That is, resistor R1 is connected between the input and the output to buffer 23a. A resistor R2 is connected across buffer 23b. That is, resistor R2 is connected between the input and the output to buffer 23b. The resistor chain connection continues with a resistor R3 connected across buffer 23c and so on. In this manner, each resistor is connected across a single non-inverting delay elements and each node in the delay line is connected to a resistor of the resistor chain.

Figure 9:
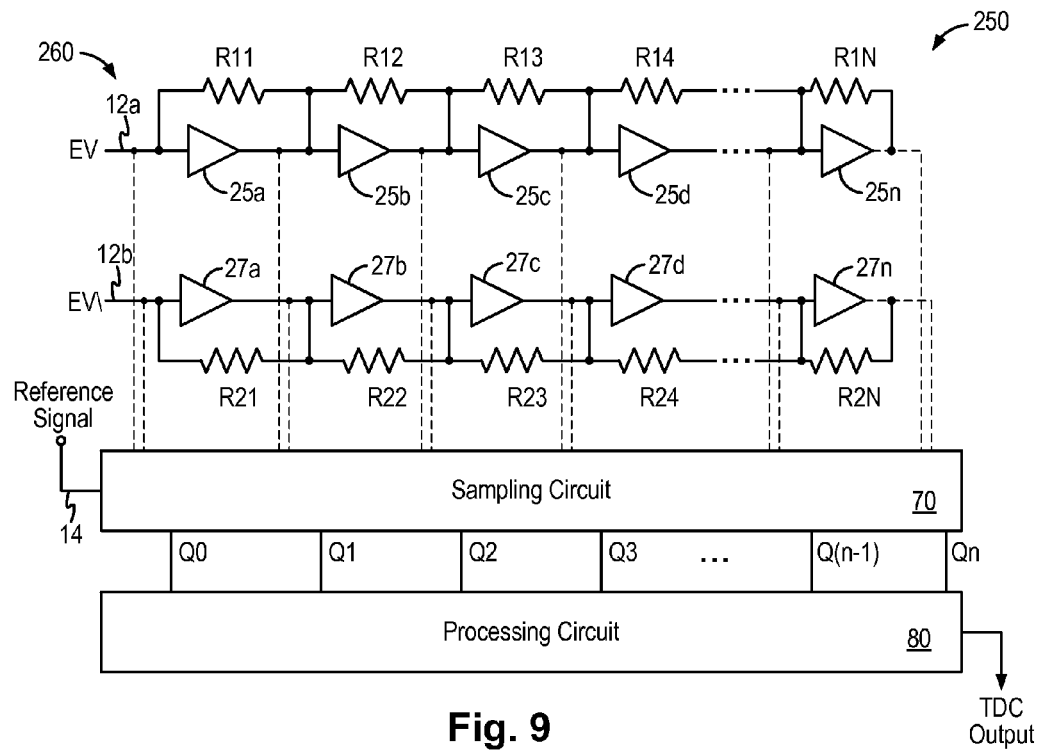
FIG. 9 is a schematic diagram illustrating a time-to-digital converter incorporating a resistor-stabilized buffer delay line with differential signaling in embodiments of the present invention.

FIG. 9 is a schematic diagram illustrating a time-to-digital converter incorporating a resistor-stabilized buffer delay line with differential signaling in embodiments of the present invention. In particular, FIG. 9 illustrates a TDC 250 constructed in a similar manner as TDC 50 of FIG. 5 and further illustrates the detail construction of a resistor-stabilized delay line 260 in the form of a buffer delay line with differential signaling. Like elements in FIGS. 5 and 9 are given like reference numerals and will not be further described.

Referring to FIG. 9, the resistor-stabilized delay line 260 includes a first serial chain of non-inverting buffers 25 and a second serial chain of non-inverting buffers 27 as the delay elements. The event signal (node 12a) is provided to the buffer 25a and the inverse of the event signal (node 12b) is provided to the buffer 27a. The event signal is propagated down the pair of buffer chains to generate delayed versions of the event signal edge, in differential format, at the output of each delay stage. More specifically, the two chains of buffers 25 and 27 are each connected in series. That is, the output of a buffer 25 of the first serial chain is connected to the input of the next buffer 25 in the same serial chain. Meanwhile, the output of a buffer 27 of the second serial chain is connected to the input of the next buffer 27 in the same serial chain. For example, the output of a buffer 25a from the first serial chain is connected to the input of a buffer 25b from the same serial chain. The output of a buffer 27a from the second serial chain is connected to the input of a buffer 27b from the same serial chain. The serial-connection of the first and second serial chain of buffers 25, 27 continues in this manner to the last buffer elements 25n and 27n.

A resistor chain is connected to the delay elements in the differential delay line to stabilize the delay variations of the buffers. For the differential delay line, the resistor chain includes a first serial chain of resistors R11 to R1N and a second serial chain of resistors R21 to R2N. The resistors of the resistor chain are connected to the delay elements by connecting across pairs of common mode nodes of adjacent delay elements in the delay line. In the case of a buffer delay chain, each resistor is connected across a single buffer in the same serial chain of buffers to realize the common mode connection.

For example, a resistor R11 is connected across a buffer 25a, that is, between the input node and the output node to buffer 25a, where the two nodes are common mode nodes. A resistor R12 is connected across a buffer 25b, that is, between the input node and the output node to buffer 25b, where the two nodes are common mode nodes. Meanwhile, a resistor R21 is connected across a buffer 27a, that is, between the input node and the output node to buffer 27a, where the two nodes are common mode nodes. A resistor R22 is connected across a buffer 27b, that is, between the input node and the output node to buffer 27b, where the two nodes are common mode nodes. In this manner, each resistor is connected to two common nodes in each serial chain of buffers.

Figure 10:
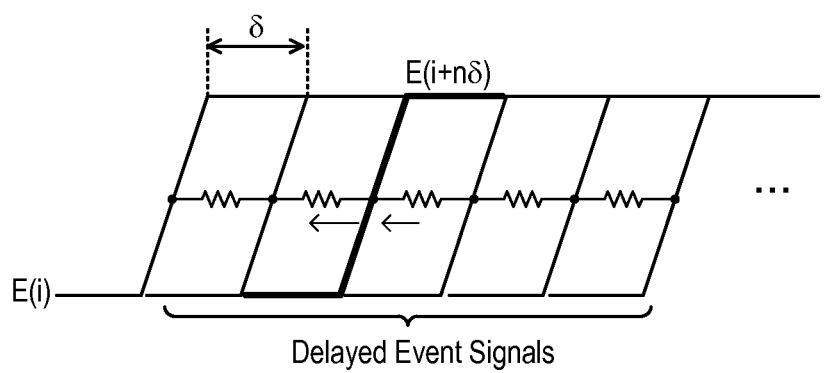
FIG. 10 illustrates the operation of the resistor-stabilized delay chain in some example.

The operation of the resistor-stabilized delay line can be explained with reference to FIG. 10. FIG. 10 illustrates the signals waveform of an event signal edge E(i) and a sequence of delayed event signal edge. The resistor connected across the common mode node of the delay line has the effect of maintaining the delay of the delay elements around the mean value. For example, for a delayed event signal edge E(i+nδ), if the delay variation of the delay element becomes too large and the delay value becomes smaller or larger than the mean value, the signal edge may be pushed towards the previous delayed signal edge or pushed towards the next delayed signal edge. However, the resistors connected to the common mode nodes will push or pull the signal edge back to the desired delay value range. In this manner, the delay variation of the delay elements of the delay line is significantly reduced.

The use of the resistor chain to stabilize the delay variation can have the effect of increasing leakage current. However, in the delay line, as the event edge is propagated through the delay line, only a small part of the delay line is active. Thus, only a small number of resistors are active to limit the delay variations. Furthermore, because the resistors are connected across common mode nodes, no current flow through the resistors most of the time. A small current flows in the resistor when the resistor is active to pull a signal edge back to the desired range.

In the above described embodiments, the event signal edge and the reference signal edge are both described as having a logical low to a logical high transition. The logical levels described above are illustrative only and are not intended to be limiting. One of ordinary skill in the art would appreciate that the time-to-digital converter can be implemented using edge transitions for the event signal and the reference signal having low-to-high or high-to-low transitions. The delay line, the sampling circuit and the processing circuit can be configured accordingly based on the logical levels of the event signal and the reference signal.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A time-to-digital converter, comprising:
a resistor-stabilized delay line comprising a serial configuration of delay elements and a resistor chain connected to the delay elements, each resistor of the resistor chain being connected across two common mode nodes of adjacent delay elements in the delay line, the resistor-stabilized delay line being configured to receive an event signal having an edge transition and to generate at the delay elements a plurality of delayed event signals with increasing delay;
a sampling circuit configured to receive the event signal and the plurality of delayed event signals as input signals, the sampling circuit being configured to sample the input signals in response to an edge transition on a reference signal and to generate an output signal being a thermometer code having a transition between a first logical state to a second logical state indicative of a time interval between the edge transition of the event signal and the edge transition of the reference signal; and
a processing circuit configured to receive the output signal of the sampling circuit and to generate a processed output signal indicative of the time interval.

2. The time-to-digital converter of claim 1, wherein the resistor-stabilized delay line comprises a delay line configured for single-ended signaling, wherein the serial configuration of delay elements comprises a single serial chain of delay elements.

3. The time-to-digital converter of claim 2, wherein the single serial chain of delay elements comprises a single serial chain of inverters and wherein each resistor in the resistor chain is connected to an input node of a first inverter in the serial chain and an output node of a second inverter in the serial chain, the second inverter being adjacent to the first inverter.

4. The time-to-digital converter of claim 2, wherein the single serial chain of delay elements comprises a single serial chain of non-inverting buffers and wherein each resistor in the resistor chain is connected to an input node and an output node of a corresponding non-inverting buffer in the serial chain.

5. The time-to-digital converter of claim 1, wherein the resistor-stabilized delay line comprises a delay line configured for differential signaling, wherein the serial configuration of delay elements comprises a first serial chain of delay elements configured to receive the event signal and a second serial chain of delay elements configured to receive an inverse of the event signal.

6. The time-to-digital converter of claim 5, wherein the first serial chain of delay elements comprises a first serial chain of inverters and the second serial chain of delay elements comprises a second serial chain of inverters, the first and serial chains of inverters being cross-connected; and wherein the resistor chain comprises a first resistor chain and a second resistor chain, each resistor in the first resistor chain being connected to an input node of a first inverter in the first serial chain and an input node of a second inverter in the first serial chain, the second inverter being adjacent to the first inverter, and each resistor in the second resistor chain being connected to an input node of a third inverter in the second serial chain and an input node of a fourth inverter in the second serial chain, the fourth inverter being adjacent to the third inverter.

7. The time-to-digital converter of claim 5, wherein the first serial chain of delay elements comprises a first serial chain of non-inverting buffers connected in series and the second serial chain of delay elements comprises a second serial chain of non-inverting buffers connected in series; and wherein the resistor chain comprises a first resistor chain and a second resistor chain, each resistor in the first resistor chain being connected to an input node and an output node of a non-inverting buffer in the first serial chain and each resistor in the second resistor chain being connected to an input node and an output node of a non-inverting buffer in the second serial chain.

8. The time-to-digital converter of claim 1, wherein the edge transition of the event signal comprises a logical low to a logical high signal transition or a logical high to a logical low signal transition.

9. The time-to-digital converter of claim 1, wherein the edge transition of the reference signal comprises a logical low to a logical high signal transition or a logical high to a logical low signal transition.

10. The time-to-digital converter of claim 2, wherein the sampling circuit comprises a plurality of D flip-flops, each D flip-fop having a data input terminal configured to receive the event signal or one of the plurality of delayed event signals, a clock input terminal configured to receive the reference signal and an output terminal providing an output signal being a part of the thermometer code output signal of the sampling circuit.

* * * * *